(12) United States Patent
Cripe

(10) Patent No.: US 8,040,183 B1
(45) Date of Patent: Oct. 18, 2011

(54) TURN-ON/TURN-OFF SNUBBER FOR A METALLIC-OXIDE-SEMICONDUCTOR FIELD-EFFECT TRANSISTOR (MOSFET) CLASS-D POWER AMPLIFIER

(75) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 94 days.

(21) Appl. No.: 12/562,723

(22) Filed: Sep. 18, 2009

(51) Int. Cl.
*H03F 3/217* (2006.01)
(52) U.S. Cl. ........................................ 330/251
(58) Field of Classification Search .............. 330/10, 330/251, 207 A
See application file for complete search history.

(56) References Cited

U.S. PATENT DOCUMENTS 6,469,919 B1 * 10/2002 Bennett ...................... 363/56.02

* cited by examiner

*Primary Examiner* — Robert Pascal
*Assistant Examiner* — Khiem Nguyen
(74) *Attorney, Agent, or Firm* — Daniel M. Barbieri

(57) ABSTRACT

The present invention is an H-bridge power amplifier circuit which includes diodes connected in parallel with MOSFET switch pairs of the circuit, each MOSFET switch pair including a MOSFET switch and a reverse-conduction blocking switch. Further, the circuit includes a snubber inductor which is connected to the switch pairs and the diodes. The circuit further includes a control branch/control sub-circuit having a snubber capacitor and a control MOSFET switch. The circuit is configured for: blocking MOSFET negative current to prevent body diode conduction; inhibiting/preventing turn-off losses of the MOSFETs; and reducing switching losses associated with operation into inductive mistuning.

12 Claims, 1 Drawing Sheet

US 8,040,183 B1

TURN-ON/TURN-OFF SNUBBER FOR A METALLIC-OXIDE-SEMICONDUCTOR FIELD-EFFECT TRANSISTOR (MOSFET) CLASS-D POWER AMPLIFIER

FIELD OF THE INVENTION

The present invention relates to the field of advanced radio systems and particularly to a turn-on/turn-off snubber for a metallic-oxide-semiconductor field-effect transistor (MOSFET) Class-D power amplifier.

BACKGROUND OF THE INVENTION

A number of existing power amplifiers (PA's) may not provide a desired level of performance.

Thus, it would be desirable to provide a power amplifier which obviates problems associated with existing solutions.

SUMMARY OF THE INVENTION

Accordingly, an embodiment of the present invention is directed to a first switch pair, the first switch pair including a first MOSFET switch and a first reverse-conduction blocking switch, the first MOSFET switch being connected to the first reverse-conduction blocking switch; a second switch pair, the second switch pair being connected to the first switch pair, the second switch pair including a second MOSFET switch and a second reverse-conduction blocking switch, the first reverse-conduction blocking switch and the second reverse-conduction blocking switch being reverse-connected N-channel MOSFETs, the second MOSFET switch being connected to the second reverse-conduction blocking switch; a first diode, the first diode being connected in parallel with the first switch pair; a second diode, the second diode being connected in parallel with the second switch pair; a snubber inductor, the snubber inductor being connected to the first switch pair, the second switch pair, the first diode and the second diode; and a control branch, the control branch being connected to the first switch pair, the second switch pair and the snubber inductor, the control branch including a snubber capacitor and a control MOSFET switch, the snubber capacitor being connected to the control MOSFET switch, wherein, when an output loading for the circuit is mistuned inductively, the control MOSFET switch is configured for being driven on for inserting the snubber capacitor into the circuit and, when the first MOSFET switch is being driven off, inductive phase load current is diverted into the snubber capacitor via an increasing switch node voltage, thereby decreasing turn-off losses for the first MOSFET switch; wherein, when an output loading for the circuit is mistuned capacitively and the first reverse-conduction blocking switch is driven off, the first reverse-conduction blocking switch is configured for directing reverse current to the first diode and the first snubber inductor, thereby at least inhibiting reverse current flow through the first MOSFET switch, wherein, after the first MOSFET switch is driven off and as the second MOSFET switch and the second reverse-conduction blocking switch are driven on, the snubber inductor is configured for limiting recovery current flow to the second diode.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Figure 1:
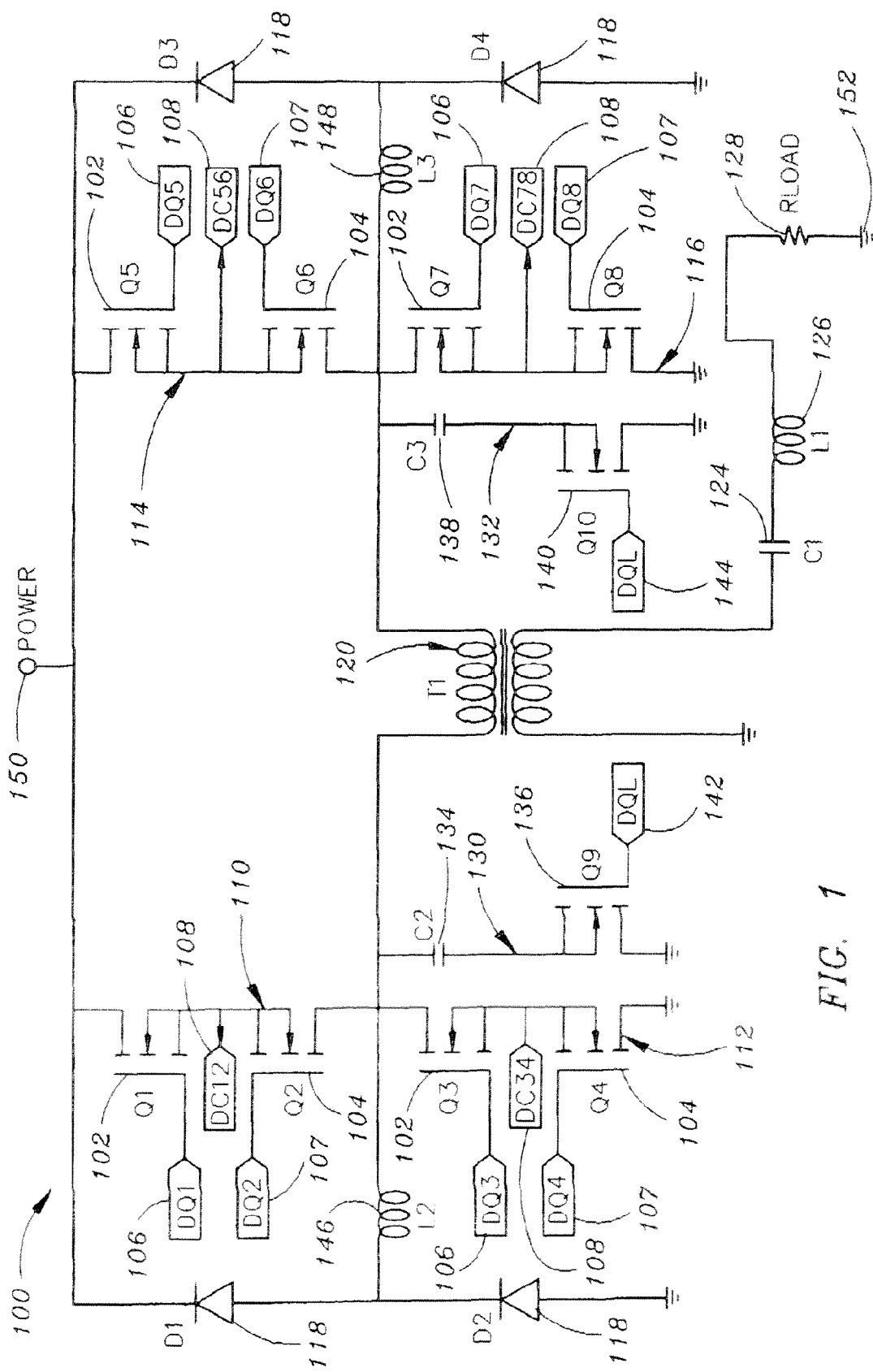
FIG. 1 is a block diagram schematic of a switching bridge topology (ex.—a modified switching bridge topology) in accordance with an exemplary embodiment of the present invention.

Reference will now be made in detail to the presently preferred embodiments of the invention, examples of which are illustrated in the accompanying drawings.

Currently, an H-bridge/H-bridge power amplifier comprised of switching elements is generally recognized as providing maximum realizable efficiency and power output-per-device for a given switching semiconductor device. A MOSFET H-bridge is often the circuit of choice for power amplifiers from audio through medium frequencies. In operation, a simple H-bridge power amplifier may include switches in alternate corners of the bridge which are driven into conduction for half-cycles of the RF period. The differential output voltage, present at the output nodes of the bridge, may be a voltage square-wave with a peak-to-peak amplitude which is twice the supply voltage.

The output circuit of the simple H-bridge power amplifier may behave as a low-pass or band-pass network, which may present a substantially resistive impedance to the fundamental, and a higher impedance to all harmonics. Consequently, the output current of the simple H-bridge power amplifier may nominally be a sine wave in-phase with the square-wave voltage waveform. The current waveform of each switch within the H-bridge is a half-sinusoid, starting from, and returning to zero amperes within the period of switch conduction. Since there is, during the RF cycle, no simultaneous occurrence of high voltage and current within the switch, the dissipation within the switch is low, allowing the highly-efficient generation of RF power.

The H-bridge power amplifier may encounter non-ideal loads (ex.—non-unity load Voltage Standing Wave Ratio (VSWR)) during conditions of modulation into narrow-band antennas. In such instances, the nominally real antenna impedance may possess a non-zero, imaginary reactance. This may result in a shift of the phase of the output current of the power amplifier (PA output current) with respect to the output voltage. Consequently, the output current may be non-zero during the intervals of MOSFET switching. The finite switching speed of the MOSFET switches may result in a period of high loss when/where the MOSFET switches while conducting substantial amounts of current.

If output loading is mis-tuned inductively, the PA output current may lag behind the output voltage in phase, such that the MOSFET current waveform swing may be non-zero and positive at the turn-off of the switch. During turn-off, the current of the MOSFET may be falling as the drain-source voltage is increasing and, a substantial loss may be generated. A particularly stressful condition exists for conditions where the PA output loading is mistuned capacitively. The PA output current may precede the output voltage in phase, so the MOSFET current waveform may swing negatively below zero prior to the turn-off of the switch, at which point this negative current may flow through the body diode of the MOSFET. The body diode of the MOSFET may be a parasitic structure inherent within the MOSFET/MOSFET structure. Recovery of this body diode conduction may be very slow compared to the normal switching characteristics of the MOSFET, and may also be stressful. Body diode recovery into a high dv/dt (differential in voltage with respect to a differential in time) is a primary source of MOSFET failure.

To prevent this phenomenon, a current solution may be to provide a modified circuit in which negative current flow through the MOSFET is blocked via the use of external diodes. Generally, a Schottky diode may be placed in series with the drain of each MOSFET of a basic MOSFET H-bridge to form the modified circuit. Further, a fast-recovery diode may be placed in parallel with this modified circuit to divert reverse current around the switch. While a modification of the basic MOSFET H-bridge in the above-referenced manner may largely prevent MOSFET failure caused by capacitive load mis-tuning, the presence of the additional diode in series with each switch may add to the overall losses of the modified circuit, thereby adding the diode-voltage-drop to each leg of the circuit. Further, the recovered charge of each of the paralleled fast recovery diodes may appear in the opposite MOSFET during switching on/powering on, thereby increasing switching losses of said opposite MOSFET. Thus, the benefit of improved reliability in the modified circuit comes with a penalty of reduced efficiency. Consequently, it may be required that the power amplifier be significantly over-designed to accommodate these additional switching losses.

The exemplary embodiments of the present invention disclosed herein provide an H-bridge power amplifier system which may: block MOSFET negative current to prevent body diode conduction, but allow for lower losses compared to systems which use a series diode; prevent the switching stresses resulting from the recovery of the parallel fast-recovery diode during turn-on of an opposite leg MOSFET; and may reduce switching losses associated with operation into inductive mistuning.

Further, said disclosed exemplary embodiments of the system of the present invention may provide a H-bridge power amplifier system which may be a Very Low Frequency (VLF)/Low Frequency (LF) power amplifier and may have improved efficiency over current power amplifier solutions, especially into complex loads.

Referring to FIG. 1, an H-bridge power amplifier circuit/output circuit/H-bridge power amplifier/H-bridge MOSFET power amplifier/H-bridge/MOSFET H-bridge/bridge/circuit/power amplifier/Class-D power amplifier/Class-D MOSFET switching-bridge power amplifier in accordance with an exemplary embodiment of the present invention is shown. The circuit 100 may include a plurality of transistors (ex.—Q1 through Q10). A first group of transistors/switches 102 (ex.—Q1, Q3, Q5 and Q7) included in the plurality of transistors are configured for performing the main switching functions of the circuit 100. For example, each transistor included in the first group of transistors 102 may be a MOSFET switch.

In the illustrated embodiment, the circuit 100 may further include a second group of transistors 104 (ex.—Q2, Q4, Q6, Q8) included in the plurality of transistors. Each transistor included in the second group of transistors 104 may be a reverse-connected N-channel MOSFET/a reverse-conduction blocking switch. Further, each transistor included in the second group of transistors 104 may be low-voltage, low Rdson MOSFET. For instance, each transistor included in the second group of transistors 104 may be implementable as a synchronous rectifier. Implementation of the reverse-connected N-channel MOSFETs 104 may be an alternative to the above-described current solution of implementing Schottky diodes. As one or more transistors included in the second group of transistors 104 may have an Rds as low as 1 milliohm, losses of said transistors 104 may be significantly less than losses of the Schottky diodes they replace.

In further embodiments, the first group of transistors 102 (ex.—Q1, Q3, Q5, Q7) may be driven by a plurality of corresponding drive signals 106 (ex.—DQ1, DQ3, DQ5 and DQ7, respectively). In exemplary embodiments, the second group of transistors 104 may be driven by a plurality of corresponding drive signals 107 (ex.—DQ2, DQ4, DQ6 and DQ8, respectively). Further, each transistor included in the first group of transistors 102 may be connected to a corresponding transistor included in the second group of transistors 104. For instance, Q1 may be connected to Q2, Q3 may be connected to Q4, Q5 may be connected to Q6, and Q7 may be connected to Q8. Further, a plurality of nodes/common nodes 108 may connect the first group of transistors 102 to their corresponding second group transistors 104. For example, Q1 may be connected to Q2 via common node DC 12, Q3 may be connected to Q4 via common node DC 34, Q5 may be connected to Q6 via common node DC 56, and Q7 may be connected to Q8 via common node DC 78. In additional embodiments, the H-bridge circuit 100 may include a plurality of legs. For instance, a first leg 110 may include transistors Q1 and Q2, a second leg 112 may include transistors Q3 and Q4, a third leg 114 may include transistors Q5 and Q6, and a fourth leg 116 may include transistors Q7 and Q8.

In exemplary embodiments, the circuit 100 may further include a plurality of diodes 118 (ex.—D1, D2, D3 and D4). The diodes 118 may be fast-recovery diodes which are connected in parallel with respective legs (110, 112, 114, 116) of the circuit 100. For example, D1 may be connected in parallel with the first leg 110, D2 may be connected in parallel with the second leg 112, D3 may be connected in parallel with the third leg 114, and D4 may be connected in parallel with the fourth leg 116.

In further embodiments, the circuit 100 may further include a transformer/output transformer 120 (T1). The output transformer 120 may be connected to the legs (110, 112, 114, 116) of the circuit, and when the circuit 100 is connected to a load (not shown) the output transformer 120 may be connected to the load via a branch 122 of the circuit 100, said branch 122 including a capacitor 124 (C1) connected to an inductor 126 (L1) connected to a resistor 128 (R load) (ex.—input resistance to the load).

In current embodiments of the present invention, the circuit 100 may include a plurality of control branches, such as a first control branch 130 and a second control branch 132. For example, the first control branch 130 may be connected to the first leg 110 and the second leg 112, while the second control branch 132 may be connected to the third leg 114 and the fourth leg 116. The first control branch 130 may include a first snubber capacitor 134 (C2) connected to a first control MOSFET/first control switch MOSFET 136 (Q9). The second control branch 132 may include a second snubber capacitor 138 (C3) connected to a second control MOSFET/second control switch MOSFET 140 (Q10). The first control MOSFET 136 (Q9) may be driven by a first control MOSFET drive signal 142 (DQL), and the second control MOSFET 140 (Q10) may be driven by a second control MOSFET drive signal 144 (DQL).

In exemplary embodiments, the circuit 100 may further include one or more snubber inductors. For example, the circuit 100 may include a first snubber inductor 146 (L2) and a second snubber inductor 148 (L3). In further embodiments, the first snubber inductor 146 may be connected to the first leg 110, the second leg 112, the first control branch 130, a first diode (D1) included in the plurality of diodes 118 and a second diode (D2) included in the plurality of diodes 118. In additional embodiments, the second snubber inductor 148 may be connected to the third leg 114, the fourth leg 116, the second control branch 132, a third diode (D3) included in the plurality of diodes 118 and a fourth diode (D4) included in the plurality of diodes 118.

In current embodiments of the present invention, the circuit 100 may include a circuit input 150. For example, the circuit input 150 may be connected to a power source (not shown) so that a power input (ex.—an input voltage/supply voltage) may be received by the circuit 100 via the input 150. Further, the circuit 100 may include a circuit output 152. For instance, the circuit output 152 may be connected to the load (not shown) so that a power output may be provided to/applied across the load via the output 152.

In further embodiments of the present invention, the drive signals 107 for the reverse-conduction blocking switches 104 may be timed to synchronize with output transformer current zero crossings (the circuitry for which is not shown). Thus, each of the reverse-conduction blocking switches 104 are configured for diverting reverse current in/from their (the switch's' 104) corresponding H-bridge leg (110, 112, 114 or 116) into their (the switch's 104) corresponding parallel diode 118. For instance, reverse-conduction blocking switch (Q2) may be configured for diverting reverse current in/from the first leg 110 into diode (D1), reverse-conduction blocking switch (Q4) may be configured for diverting reverse current in/from the second leg 112 into diode (D2), reverse-conduction blocking switch (Q6) may be configured for diverting reverse current in/from the third leg 114 into diode (D3), and reverse-conduction blocking switch (Q8) may be configured for diverting reverse current in/from the fourth leg 116 into diode (D4).

In operation, switches 102, 104 in alternate legs (ex.—corners) of the bridge 100 may be driven on and/or driven into conduction for half-cycles of an RF period. For example, during a first half-cycle, switches Q1 and Q2 of the first leg 110 of the circuit 100 and switches Q7 and Q8 of the fourth leg 116 of the circuit 100 may be switched on/powered on/turned on/driven on/driven into conduction. During this first half-cycle, switches Q3, Q4, Q5 and Q6 may be driven off. Further, during a second half-cycle, switches Q1, Q2, Q7 and Q8 may be driven off, and switches Q3, Q4, Q5 and Q6 may be driven on/driven into conduction.

In exemplary embodiments of the present invention, when the circuit/power amplifier 100 encounters a capacitively mistuned load impedance, each of the H-bridge legs (110, 112, 114, 116) may be configured to pass reverse current (ex.—negative current) through their respective parallel diodes 108 at the end of a switch conduction half-cycle/half-cycle for an RF period. For example, during a switch conduction half-cycle, switches Q1 and Q2 may be on. At/towards the end of the switch conduction half-cycle, reverse-conduction blocking switch Q2 may be driven off in order to place switch Q2 into a non-conducting state. By placing reverse blocking conduction switch Q2 into a non-conducting state, negative/reverse current flow may be blocked, such that negative/reverse current flow is prevented/inhibited through switch Q1 and is diverted to diode D1. Thus, the reverse conduction blocking switches 104 (such as Q2) serve to prevent body diode conduction, but with fewer losses than is achieved when implementing Schottky diodes. Further, by placing switch Q2 into a non-conducting state, negative/reverse current flow may also be diverted by switch Q2 to its corresponding snubber inductor 146 (L2). In exemplary embodiments, the snubber inductors (146, 148) may be configured for limiting recovery current into their corresponding diodes 118. For example, in the scenario above where switch Q2 is driven into non-conduction/is driven off, switch Q1 may also be driven off, negative/reverse current flow may be diverted to diode D1 and to snubber inductor 146, and then switches Q3 and Q4 may be powered on. As switches Q3 and Q4 are switching on, the snubber inductor 146 stores energy/limits recovery current flow into corresponding diode D2 and greatly reducing resulting dissipation in switch Q3. Thus, the snubber inductors 146, 148 serve to eliminate/reduce switching turn-on losses (ex.—switching stresses) which are prevalent with prior solutions. Further, in an opposite scenario, snubber inductor 146 would limit recovery current flow into diode D1, when switches Q3 and Q4 are switching off and switches Q1 and Q2 are switching on. Also, in like manner, when switch Q4 is switched off, switch Q4 may block negative/reverse current flow through switch Q3 and may divert negative/reverse current to diode D2 and snubber inductor 146. Still further, snubber inductor 148 functions with diodes (D3 and D4), and switches (Q5, Q6, Q7 and Q8) in a manner analogous to the manner in which snubber inductor 146 functions with diodes (D1 and D2), and switches (Q1, Q2, Q3 and Q4).

In further embodiments, the nominal value of the snubber inductors (146, 148) may be such that their impedance at operating frequency has a magnitude one-tenth or less than that of the load impedance, as reflected across the output transformer 120.

In exemplary embodiments of the present invention, when the circuit/power amplifier 100 encounters an inductively mistuned load impedance, the control switch(es) (136, 140)/(Q9, Q10) may be continually driven on via their corresponding drive signals 107 (DQL) to insert the snubber capacitor(s) (134, 138)/(C2, C3) into the circuit 100. As the H-bridge switches (102, 104) attempt to turn off while conducting inductive phase load current, the inductive phase load current may be diverted into the snubber capacitors (134, 138) by a rising switch node voltage. Drain currents of the switches (102, 104) drop and the turn-off differential in voltage with respect to time (dv/dt) for the switches (102, 104) is slowed, essentially eliminating turn-off losses of the switches (102, 104). The nominal value(s) of the snubber capacitors (134, 138) may be such that at operating frequency, the snubber capacitors (134, 138) may have an impedance which is ten times greater (or more) than the load impedance. As the Root Mean Square (RMS) current through the snubber capacitors (134, 138) may be a small fraction of the load current, the control MOSFETs (136, 140) may be a fraction of the size of the corresponding H-bridge switches (102, 104). In further embodiments, determination of when to turn on the control switch MOSFETs (136, 140) may be determined by a phase comparison of the output zero crossings of the output transformer 120 with respect to the output voltage of the circuit 100.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An H-bridge power amplifier circuit, comprising:
   a first switch pair, the first switch pair including a first MOSFET switch and a first reverse-conduction blocking switch, the first MOSFET switch being connected to the first reverse-conduction blocking switch;
   a second switch pair, the second switch pair being connected to the first switch pair, the second switch pair including a second MOSFET switch and a second reverse-conduction blocking switch, the second MOSFET switch being connected to the second reverse-conduction blocking switch;
   a first diode, the first diode being connected in parallel with the first switch pair;
   a second diode, the second diode being connected in parallel with the second switch pair;
   a snubber inductor, the snubber inductor being connected to the first switch pair, the second switch pair, the first diode and the second diode; and
   a control branch, the control branch being connected to the first switch pair, the second switch pair and the snubber inductor, the control branch including a snubber capacitor and a control MOSFET switch, the snubber capacitor being connected to the control MOSFET switch.

2. An H-bridge power amplifier circuit as claimed in claim 1, wherein the first reverse-conduction blocking switch and the second reverse-conduction blocking switch are reverse-connected N-channel MOSFETs.

3. An H-bridge power amplifier circuit as claimed in claim 1, wherein, when an output loading for the circuit is mistuned capacitively and the first reverse-conduction blocking switch is driven off, the first reverse-conduction blocking switch is configured for directing reverse current to the first diode and the snubber inductor, thereby at least inhibiting reverse current flow through the first MOSFET switch.

4. An H-bridge power amplifier circuit as claimed in claim 1, wherein, when an output loading of the circuit is mistuned capacitively and the second reverse-conduction blocking switch is driven off, the second reverse-conduction blocking switch is configured for directing reverse current to the second diode and the snubber inductor, thereby at least inhibiting reverse current flow through the second MOSFET switch.

5. An H-bridge power amplifier circuit as claimed in claim 3, wherein, after the first MOSFET switch is driven off and as the second MOSFET switch and the second reverse-conduction blocking switch are driven on, the snubber inductor is configured for limiting recovery current flow to the second diode.

6. An H-bridge power amplifier circuit as claimed in claim 4, wherein, after the second MOSFET switch is driven off and as the first MOSFET switch and the first reverse-conduction blocking switch are driven on, the snubber inductor is configured for limiting recovery current flow to the first diode.

7. An H-bridge power amplifier circuit as claimed in claim 1, wherein, when an output loading for the circuit is mistuned inductively, the control MOSFET switch is configured for being driven on for inserting the snubber capacitor into the circuit.

8. An H-bridge power amplifier circuit as claimed in claim 7, wherein, when the first MOSFET switch is being driven off, inductive phase load current is diverted into the snubber capacitor via an increasing switch node voltage, thereby decreasing turn-off losses for the first MOSFET switch.

9. An H-bridge power amplifier circuit, comprising:
   a first switch pair, the first switch pair including a first MOSFET switch and a first reverse-conduction blocking switch, the first MOSFET switch being connected to the first reverse-conduction blocking switch;
   a second switch pair, the second switch pair being connected to the first switch pair, the second switch pair including a second MOSFET switch and a second reverse-conduction blocking switch, the second MOSFET switch being connected to the second reverse-conduction blocking switch, the first reverse-conduction blocking switch and the second reverse-conduction blocking switch being reverse-connected N-channel MOSFETs;
   a first diode, the first diode being connected in parallel with the first switch pair;
   a second diode, the second diode being connected in parallel with the second switch pair;
   a snubber inductor, the snubber inductor being connected to the first switch pair, the second switch pair, the first diode and the second diode; and
   a control branch, the control branch being connected to the first switch pair, the second switch pair and the snubber inductor, the control branch including a snubber capacitor and a control MOSFET switch, the snubber capacitor being connected to the control MOSFET switch.

10. An H-bridge power amplifier circuit as claimed in claim 9, wherein, when an output loading for the circuit is mistuned capacitively and the first reverse-conduction blocking switch is driven off, the first reverse-conduction blocking switch is configured for directing reverse current to the first diode and the snubber inductor, thereby at least inhibiting reverse current flow through the first MOSFET switch.

11. An H-bridge power amplifier circuit as claimed in claim 10, wherein, after the first MOSFET switch is driven off and as the second MOSFET switch and the second reverse-conduction blocking switch are driven on, the snubber inductor is configured for limiting recovery current flow to the second diode.

12. An H-bridge power amplifier circuit as claimed in claim 9, wherein, when an output loading for the circuit is mistuned inductively, the control MOSFET switch is configured for being driven on for inserting the snubber capacitor into the circuit and, when the first MOSFET switch is being driven off, inductive phase load current is diverted into the snubber capacitor via an increasing switch node voltage, thereby decreasing turn-off losses for the first MOSFET switch.

* * * * *